(12) United States Patent
Kikuchi et al.

(10) Patent No.: US 8,218,706 B2
(45) Date of Patent: Jul. 10, 2012

(54) COMMUNICATION SYSTEM, RECEIVING APPARATUS, AND RECEIVING METHOD

(75) Inventors: Hidekazu Kikuchi, Kanagawa (JP);
Yoshihiro Komatsu, Kanagawa (JP);
Masahiro Segami, Kanagawa (JP)

(73) Assignee: Sony Corporation, Tokyo (JP)

( * ) Notice: Subject to any disclaimer, the term of this patent is extended or adjusted under 35 U.S.C. 154(b) by 902 days.

(21) Appl. No.: 12/274,706

(22) Filed: Nov. 20, 2008

(65) Prior Publication Data
US 2009/0147903 A1 Jun. 11, 2009

(30) Foreign Application Priority Data
Dec. 11, 2007 (JP) ................................. 2007-319326

(51) Int. Cl.
*H03D 3/24* (2006.01)
(52) U.S. Cl. ...................................................... 375/376
(58) Field of Classification Search .................... 375/376
See application file for complete search history.

(56) References Cited

U.S. PATENT DOCUMENTS

| 5,568,078 | A | * | 10/1996 | Lee | ............................... | 327/262 |
| 6,347,128 | B1 | * | 2/2002 | Ransijn | .......................... | 375/376 |
| 6,930,628 | B2 | * | 8/2005 | Reinhold et al. | .............. | 341/155 |

FOREIGN PATENT DOCUMENTS
JP  10-285051  10/1998
JP  3239543  10/2001

OTHER PUBLICATIONS

"Ultra-High Speed CMOS Interface", Fujitsu.53, 1, http://img.jp.fujitsu.com/downloads/jp/jmag/vol53-1/paper10.pdf, Jan. 2002, pp. 47-53 (with English Translation).

* cited by examiner

*Primary Examiner* — Juan A Torres
(74) *Attorney, Agent, or Firm* — Oblon, Spivak, McClelland, Maier & Neustadt, L.L.P.

(57) ABSTRACT

A communication system includes a transmission apparatus for transmitting a plurality of serial data signals that are synchronized in phase with one another and a clock signal that is synchronized in frequency with the serial data signals; and a receiving apparatus for receiving a plurality of serial data signals and the clock signal transmitted from the transmission apparatus. The receiving apparatus includes a phase synchronization circuit configured to roughly adjust the frequency in accordance with the received clock signal and then generate a reproduction clock that is synchronized in phase with one serial data signal among the plurality of serial data signals, and a phase shifter configured to shift the phase from the reproduction clock and lock the phase to another serial signal.

15 Claims, 11 Drawing Sheets

COMMUNICATION SYSTEM, RECEIVING APPARATUS, AND RECEIVING METHOD

CROSS REFERENCES TO RELATED APPLICATIONS

The present invention contains subject matter related to Japanese Patent Application JP 2007-319326 filed in the Japanese Patent Office on Dec. 11, 2007, the entire contents of which are incorporated herein by reference.

BACKGROUND OF THE INVENTION

1. Field of the Invention

The present invention relates to a communication system having a communication interface, such as High Definition Multimedia Interface (HDMI), capable of transmitting, for example, pixel data of non-compressed images in one direction, to an electronic apparatus therefor, and to a receiving method therefor.

2. Description of the Related Art

The specification "High-Definition Multimedia Interface Specification Version 1.3a" of HDMI has been distributed from HDMI LLC. In the standard of HDMI, a transmitter device is referred to as a source device, and a receiver device is referred to as a sink device.

The HDMI source and the HDMI sink have an HDMI connector to which an HDMI cable including a plurality of signal lines is connected. The HDMI connector is a connector for transmitting image data and audio data by using digital signals.

In the specification of HDMI, regarding HDMI, Transition Minimized Differential Signaling (TMDS) for transmitting pixel data and audio data at high speed from the HDMI source to the HDMI sink, and a Consumer Electronics Control (CEC) line for performing bidirectional communication between the HDMI source and the HDMI sink in one direction are defined, among others.

As described above, TMDS is used to transmit video/audio multiplexed signals of a wide band in HDMI, and is formed of one pair of differential pixel clocks and three pairs of differential serial data.

The three pairs of serial data signals are signals whose synchronization is achieved by a voltage controlled oscillator (VCO) clock generated by a common phase locked loop (PLL) in a transmitter. Therefore, although the three pairs of serial data have a phase difference due to a difference in the delay time of transmission lines, the mutual phase relationship is substantially fixed, and the basic frequency and jitter components match well.

However, only the pixel clock is not synchronized with a VCO clock of a PLL, and a reference clock that is input to the PLL is often output directly.

Therefore, the pixel clock has jitter components differing from serial data, and the clock and the phase of data constantly fluctuate dynamically.

In a receiver that receives such a group of signals and that correctly reproduces each of serial data signals, a phase-shift circuit is often used that adjusts the phase of a clock generated by a PLL frequency multiply circuit by using a pixel clock as a reference clock (see, for example, FUJITSU. 53.1, p. 47-53 (01, 2002). This method is called clock data recovery (CDR).

Figure 1:
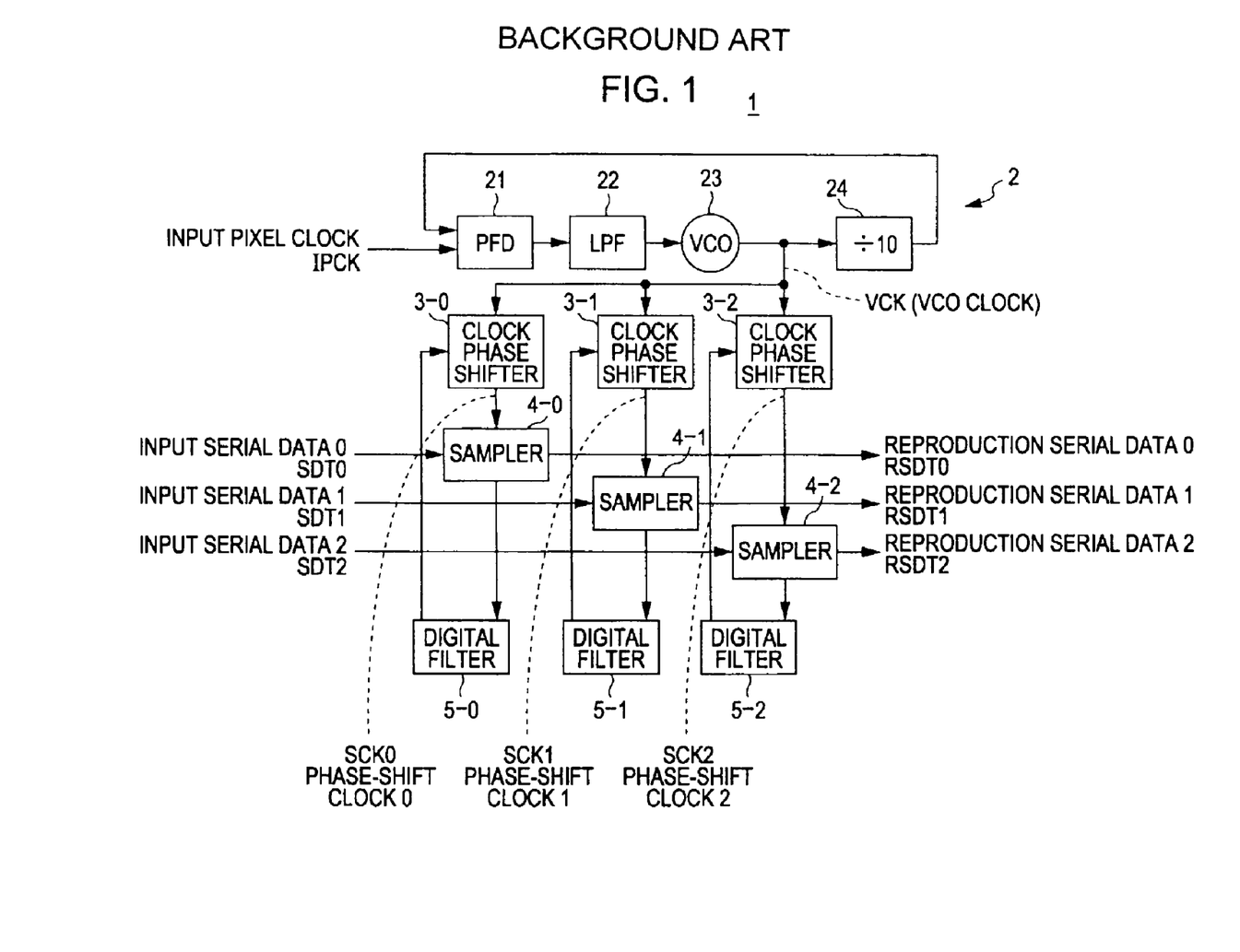
FIG. 1 is a block diagram of a circuit disclosed in FUJITSU. 53.1, p. 47-53 (01, 2002)

FIG. 1 shows, in a block diagram, a circuit disclosed in FUJITSU. 53.1, p. 47-53 (01, 2002).

A circuit 1 of FIG. 1 includes a PLL 2, clock phase shifters 3-0, 3-1, and 3-2, samplers 4-0, 4-1, and 4-2, and digital filters 5-0, 5-1, and 5-2.

An input pixel clock signal IPCK is multiplied by a PLL 2 including a phase-shift frequency detector (PFD) 21, a low-pass filter (LPF) 22, a VCO 23, and a frequency divider 24, and becomes a VCO clock VCK.

The VCO clock VCK may be a single phase clock or may be a set of multi-phase clocks in which specific phase differences are maintained.

The VCO clock VCK has a frequency equal to the bit rate of a serial data signal. However, the VCO clock VCK has jitter components possessed by the input pixel clock signal IPCK and jitter determined by the jitter characteristics of the PLL 2, which differ from the jitter possessed by the serial data signal.

Therefore, the phase difference between the VCO clock VCK and the serial data signal constantly fluctuates. If the VCO clock VCK is directly provided the samplers 4-0 to 4-2, it is not possible for the samplers to stably receive correct data.

Therefore, the clock phase shifters 3-0 to 3-2 are provided between the VCO 23 and the samplers 4-0 to 4-2, so that phase-shift clocks SCK0, SCK1, and SCK2 at which the samplers 4-0 to 4-2 can stably receive serial data are generated.

The amounts of changes in the phase of the clock phase shifters 3-0 to 3-2 are variable at several levels. The amounts of changes are determined by feedback control obtained by performing a filter operation, mainly, an integration operation, on information on the phase relationship between the phase-shift clock SCK detected by the samplers 4-0 to 4-2 and serial data.

A scheme for obtaining information on the phase relationship between the phase-shift clock and the serial data is disclosed in Japanese Patent No. 3239543.

SUMMARY OF THE INVENTION

The drawback of the CDR is that the relative phase of the VCO clock VCK and the serial data changes at high speed, that is, it is difficult for a phase-shift clock to accurately follow the phase of the serial data in a case where they have relative jitter components of a high frequency.

In HDMI, there has been a demand for a receiver to correctly operate even for a signal in which relative jitter of a pixel clock and serial data is 0.3 [UIp-p] (1[UI] is the time of 1 bit of serial data) at several MHz.

For example, if there is relative jitter in which the phase changes by 0.3 [UIp-p] in the form of a sine wave of 4 MHz, a phase shift change of ¼ [UI] occurs in a period of approximately 80 [ns] in the time zone in which the phase changes most sharply.

However, serial data of TMDS has been coded, and data transients only once at 10 bits at worst. The chance of comparing the phase of the clock with that of serial data occurs only at the time of data transition. For example, when the rate of TMDS is 250 [Mbps], there is only one chance of comparing the phases once in 40 [ns] at worst.

In such a case, each time comparison is performed, the phase difference is changed by as much as ⅛ [UI]. Since the resolving power of the phase shifter is usually 1/16 to 1/64, the phase-shift changes by an amount 2 to 8 times the resolving power.

In the circuit of Japanese Patent No. 3239543 described above, it is possible to determine whether or not the amount of phase shift should be increased or decreased, but it is not possible to make a determination as to at what multiples of the resolving power the amount of phase shift should be changed.

In the case of an increase/decrease in one unit in terms of resolving power units, it is not possible for the phase-shift clock to follow high-speed relative jitter. In a case where several units are increased/decreased all at once, detailed phase control using a high resolving power is not possible.

A sampler for making a determination as to how many units of a resolving power should be used is very complex, and a filter for processing outputs thereof and feeding back the amount of phase shift to a phase shifter also becomes complex.

It is desirable to provide a communication system capable of reproducing a clock optimum for data reproduction that correctly follows the phase of a serial data signal even when there is large high-speed relative jitter of a clock and data, a receiving apparatus therefor, and a receiving method therefor.

According to an embodiment of the present invention, there is provided a communication system including: a transmission apparatus for transmitting a plurality of serial data signals that are synchronized in phase with one another and a clock signal that is synchronized in frequency with the serial data signals; and a receiving apparatus for receiving a plurality of serial data signals and the clock signal transmitted from the transmission apparatus, wherein the receiving apparatus includes a phase synchronization circuit configured to roughly adjust the frequency in accordance with the received clock signal and then generate a reproduction clock that is synchronized in phase with one serial data signal among the plurality of serial data signals, and a phase shifter configured to shift the phase from the reproduction clock and lock the phase to another serial signal.

According to another embodiment of the present invention, there is provided a receiving apparatus for receiving a plurality of serial data signals that are synchronized in phase with one another and a clock signal that is synchronized in frequency with the serial data signals, the receiving apparatus including: a phase synchronization circuit configured to roughly adjust the frequency in accordance with the received clock signal and then generate a reproduction clock that is synchronized in phase with one serial data signal among the plurality of serial data signals; and a phase shifter configured to shift the phase from the reproduction clock and lock the phase to another serial data signal.

Preferably, the receiving apparatus further includes a reproduction circuit configured to reproduce the one serial data signal in synchronization with the reproduction clock. Preferably, the phase synchronization circuit includes a voltage-controlled oscillator configured to generate the reproduction clock, a frequency divider configured to divide the frequency of the reproduction clock, a phase comparator configured to compare the phase of the reproduction clock from the frequency divider with the phase of the received clock signal, a frequency comparator configured to compare the frequency of the reproduction clock from the frequency divider with the frequency of the clock signal and output an alarm signal when the difference between the frequencies is greater than a preset threshold value, and a selection circuit configured to, when at least the alarm signal is received, feed back an output signal of the phase comparator to a phase synchronization loop formed by the phase comparator, the voltage-controlled oscillator, and the frequency divider, and configured to, when no alarm signal is received, feed back a serial data signal from the reproduction circuit.

When a power supply is switched on or at reset time, preferably, the selection circuit feeds back the output signal of the phase comparator to the phase synchronization loop regardless of the presence or absence of the alarm signal.

Preferably, the receiving apparatus further includes a second reproduction circuit configured to reproduce a serial data signal from another received serial data signal in synchronization with a phase-shift clock from the phase shifter.

Preferably, the receiving apparatus further includes a digital filter configured to perform phase-shift feedback of an output signal of the second reproduction circuit to a corresponding phase shifter.

Preferably, the receiving apparatus further includes a phase shifter configured to, upon receiving the reproduction clock, supply a phase clock to the reproduction circuit configured to reproduce the one serial data signal. When no alarm signal is received, preferably, the selection circuit feeds back the sum of phase information on the serial data signals from the plurality of reproduction circuits to the phase synchronization loop.

Preferably, the receiving apparatus further includes a digital filter configured to perform phase-shift feedback of the output signals of the plurality of reproduction circuits to a corresponding phase shifter.

Preferably, the receiving apparatus further includes a receiving circuit at a second stage configured to receive the reproduction clock from the frequency divider and the reproduction serial data signal of each of the reproduction circuits. Preferably, the receiving circuit at the second stage includes a phase synchronization circuit configured to generate a reproduction clock that is synchronized in phase with the received clock signal; a plurality of phase shifters configured to shift the phase from the reproduction clock and lock the phase to the received serial data signals; and a reproduction circuit configured to further perform a reproduction process on serial data signals that are input in synchronization with phase clocks from the plurality of phase shifters.

Preferably, the receiving apparatus further includes a receiving circuit at a second stage configured to input a reproduction clock from the frequency divider and a reproduction serial data signal of each of the production circuits. Preferably, the receiving circuit at the second stage includes a phase synchronization circuit configured to generate a reproduction clock that is synchronized in phase with the received clock signal; a plurality of phase shifters configured to shift the phase from the reproduction clock and lock the phase to the received serial data signals; a reproduction circuit configured to further perform a reproduction process on serial data signals that are input in synchronization with phase clocks from the plurality of phase shifters; and a plurality of digital filters configured to performed phase-shift feedback of the output signals of the plurality of reproduction circuits to corresponding phase shifters.

Preferably, the receiving apparatus further includes a receiving circuit at a second stage configured to directly receive a reproduction clock from the frequency divider and a plurality of received reproduction serial data signals. Preferably, the receiving circuit at the second stage includes a phase synchronization circuit configured to generate a reproduction clock that is synchronized in phase with the received clock signal, a plurality of phase shifters configured to shift the phase from the reproduction clock and lock the phase to the received serial data signals; and a reproduction circuit configured to further perform a reproduction process on serial data signals that are input in synchronization with phase clocks from the plurality of phase shifters.

Preferably, the receiving apparatus further includes a receiving circuit at a second stage configured to directly receive a reproduction clock from the frequency divider and a plurality of received reproduction serial data signals. Preferably, the receiving circuit at the second stage includes a phase synchronization circuit configured to generate a reproduction clock that is synchronized in phase with the received clock signal, a plurality of phase shifters configured to shift the phase from the reproduction clock and lock the phase to the received serial data signals; a reproduction circuit configured to further perform a reproduction process on serial data signals that are input in synchronization with the phase clocks from the plurality of phase shifters, and a plurality of digital filters configured to perform phase-shift feedback of the output signals of the plurality of reproduction circuits to a corresponding phase shifter.

Preferably, a cable equalizer is arranged in at least one of the input stage of the received clock signal and the input stage of the plurality of serial data signals.

According to another embodiment of the present invention, there is provided a receiving method for receiving a plurality of serial data signals that are synchronized in phase with one another and a clock signal that is synchronized in frequency with the serial data signals, the receiving method including the steps of: roughly adjusting the frequency in accordance with the received clock signal and then generating a reproduction clock that is synchronized in phase with one serial data signal among the plurality of serial data signals; and shifting the phase from the reproduction clock and locking the phase to another serial data signal.

According to the embodiments of the present invention, serial data signals that are synchronized in phase and a clock signal that is synchronized in frequency with the serial data signals are transmitted from the transmission apparatus, and these signals are received by the receiving apparatus.

In the receiving apparatus, after the frequency is roughly adjusted in accordance with a clock signal received by the phase synchronization circuit, a reproduction clock that is synchronized in phase with one serial data signal is generated. In the phase shifter, the phase is shifted from the reproduction clock and is locked to another serial signal.

According to the embodiments of the present invention, even when there is large high-speed relative jitter in a clock and data, it is possible to reproduce a clock optimum for data reproduction that correctly follows the phase of a serial data signal.

DESCRIPTION OF THE PREFERRED EMBODIMENTS

Embodiments of the present invention will be described below with reference to the drawings.

Figure 2:
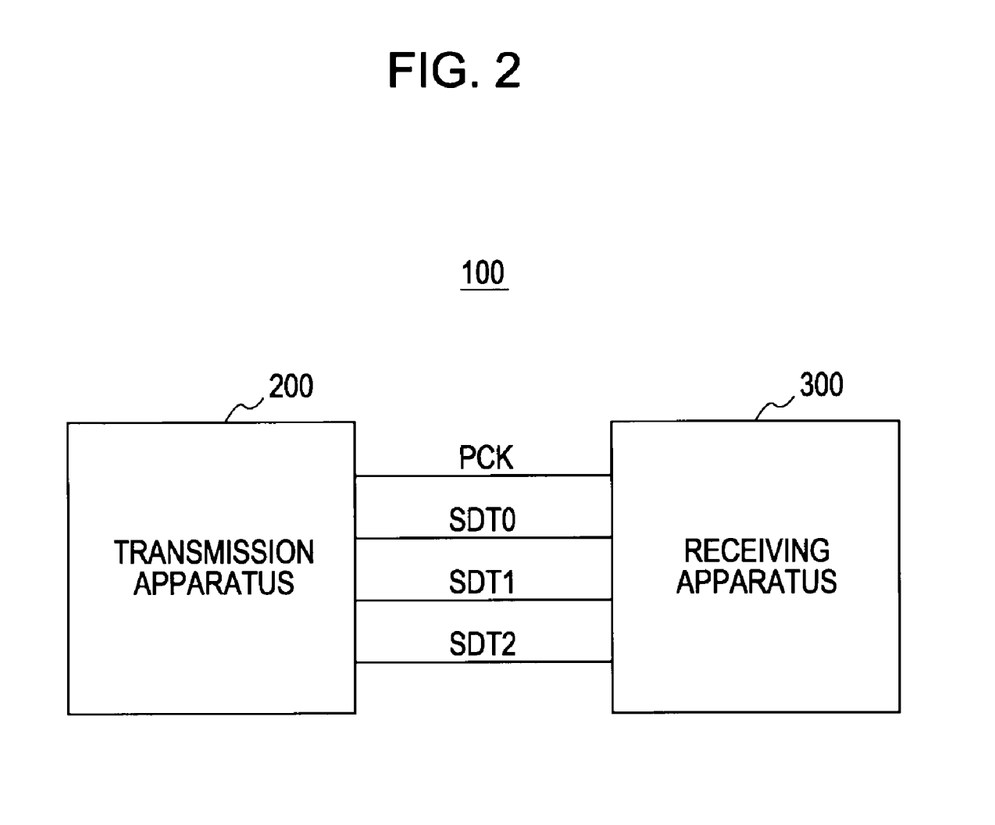
FIG. 2 shows the basic configuration of a communication system according to an embodiment of the present invention.

FIG. 2 shows the basic configuration of a communication system 100 according to an embodiment of the present invention.

The communication system 100 is configured to include a Transition Minimized Differential Signaling (TMDS) channel for transmitting, for example, pixel data and audio data at high speed from an HDMI source (transmission apparatus) to an HDMI sink (receiving apparatus).

Furthermore, the communication system 100 can be configured as a system for performing video and audio data transmission by using one communication cable, exchange and authentication of connected device information, communication of device control data, and LAN communication.

The communication system 100 includes a transmission apparatus 200 and a receiving apparatus 300.

The transmission apparatus 200 transmits, to the receiving apparatus 300, a plurality of serial data signals SDT0 to $ST_{D2}$ whose phases are synchronized with one another, and a pixel clock signal PCK that is a clock signal synchronized in frequency with the serial data signals SDT0 to SDT2.

The receiving apparatus 300 is configured to include a phase synchronization circuit (PLL) that generates a reproduction clock that is synchronized in phase with one serial data signal among a plurality of serial data signals SDT0 to SDT2, for example, the serial data signal SDT0 after the frequency is roughly adjusted in accordance with the received input pixel clock signal PCK, and a phase shifter that shifts the phase from the reproduction clock and lock the phase to another serial data signal.

The configuration and functions of the receiving apparatus 300 having a feature configuration of the present embodiment will be described below specifically.

Figure 3:
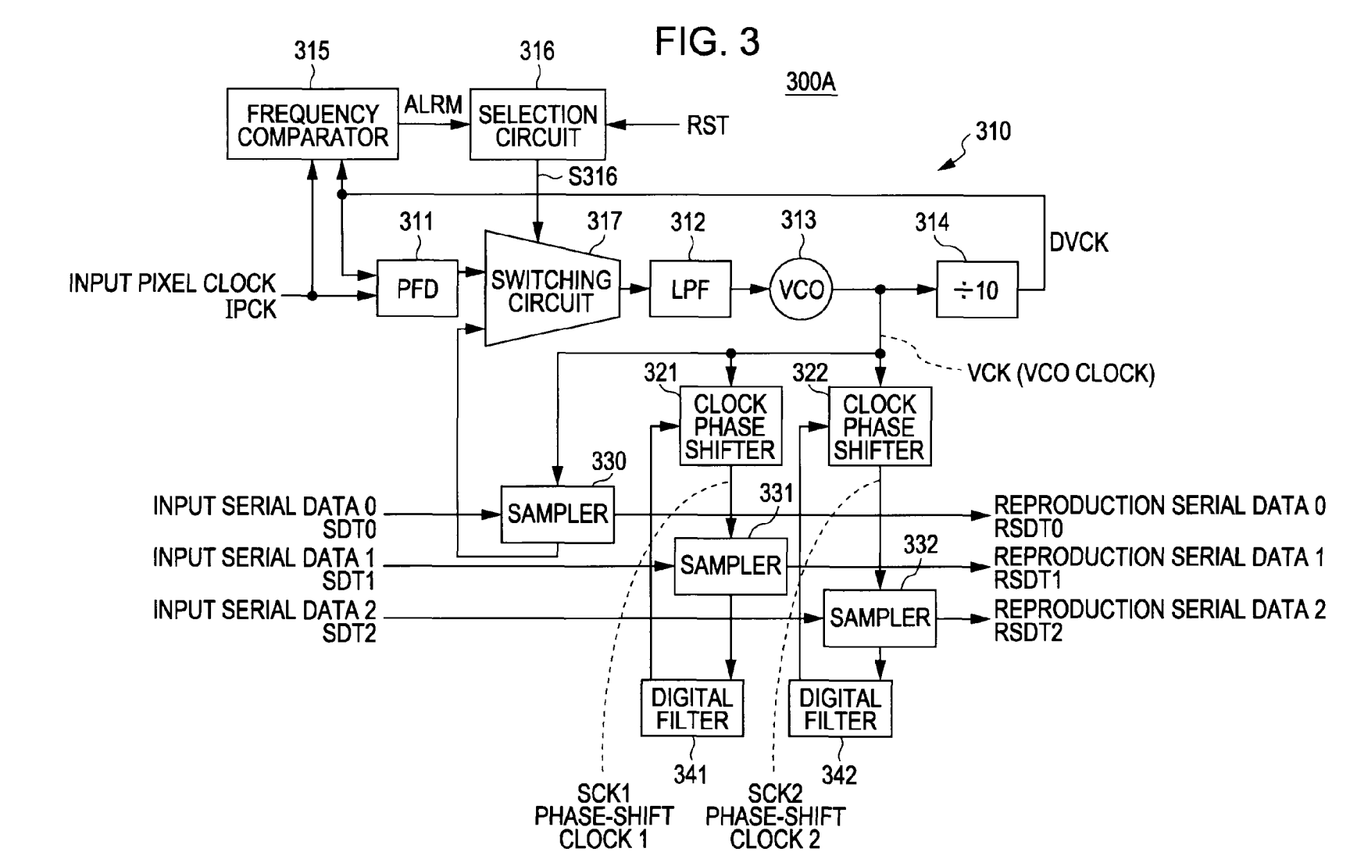
FIG. 3 shows the configuration of a receiving apparatus according to a first embodiment of the present invention.

FIG. 3 shows the configuration of a receiving apparatus 300A according to a first embodiment of the present invention.

The receiving apparatus 300A of FIG. 3 includes a PLL (phase synchronization circuit) 310, clock phase shifters 321 and 322, samplers 330, 331, and 332 serving as reproduction circuits, and digital filters 341 and 342.

In this configuration, the samplers 331 and 332 correspond to second reproduction circuits.

As shown in FIG. 3, the PLL 310 includes a phase frequency comparator (PFD) 311, a low-pass filter (LPF) 312, a VCO 313, a frequency divider 314, a frequency comparator 315, a selection circuit 316, and a switching circuit 317.

The PFD 311 compares the phase (frequency) of the input pixel clock signal IPCK with the phase (frequency) of the reproduction clock (VCO clock) DVCK that is frequency-divided by the frequency divider 314 in a phase synchronization loop, and outputs the result to the switching circuit 317.

The LPF 312 receives one of the output of the PFD 311 and the output signal of the sampler 330 from the switching circuit 317 and supplies a control voltage VCTL at a predetermined level to the VCO 313.

The VCO 313 oscillates at a frequency corresponding to the control voltage VCTL from the LPF 312 and supplies a VCO clock (reproduction clock) VCK to the frequency divider 314, the clock phase shifters 321 and 322, and the sampler 330.

The frequency divider 314 outputs a VCO clock DVCK such that the frequency of the VCO clock VCK supplied from the VCO 313 is divided by one tenth (multiplied by 10) to the PFD 311 and the frequency comparator 315.

The frequency comparator 315 generates an alarm signal ALRM in a case where the difference between the frequency of the input pixel clock signal IPCK and the frequency of the reproduction clock (VCO clock) DVCK that is frequency-divided by the frequency divider 314 in the phase synchronization loop is greater than a preset threshold value VTH, and outputs the alarm signal ALRM to the selection circuit 316.

When the selection circuit 316 receives the alarm signal ALRM from the frequency comparator 315, the selection circuit 316 outputs a switching signal S316 to the switching circuit 317 so that the output of the PFD 311 is selected and input to the LPF 312.

When a reset signal RST is received or when the power supply is switched on, also, the selection circuit 316 outputs the switching signal S316 to the switching circuit 317 so that the output of the PFD 311 is selected and input to the LPF 312.

On the other hand, in a case where the alarm signal ALRM or the reset signal RST is not input, or the power supply is established, the selection circuit 316 outputs the switching signal S316 to the switching circuit 317 so that the output of the sampler 330 is selected and input to the LPF 312.

The switching circuit 317 selects one of the output of the PFD 311 and the output of the sampler 330 in response to the switching signal S316 of the selection circuit 316, and inputs it to the LPF 312.

The clock phase shifter 321 shifts in a half fixed manner the phase of the VCO clock VCK supplied from the VCO 313, and outputs a phase-shift clock SCK1 to the sampler 331.

The clock phase shifter 321 generates an optimum phase-shift clock SCK1 in response to a signal from the digital filter 341.

The clock phase shifter 322 shifts in a half fixed manner the phase of the VCO clock VCK supplied from the VCO 313, and outputs a phase-shift clock SCK2 to the sampler 332.

The clock phase shifter 322 generates an optimum phase-shift clock SCK2 in response to a signal from the digital filter 342.

The sampler 330 samples the input serial data signal SDT0 in synchronization with the VCO clock VCK supplied from the VCO 313 in order to generate a reproduction serial data signal RSDT0, and supplies the signal to the switching circuit 317 of the PLL 310.

The sampler 331 samples an input serial data signal SDT1 in synchronization with the VCO clock VCK supplied from the VCO 313, generates a reproduction serial data signal RSDT1, and supplies the signal to the digital filter 341.

The sampler 332 samples the input serial data signal SDT2 in synchronization with the VCO clock VCK supplied from the VCO 313, generates a reproduction serial data signal RSDT2, and supplies the signal to the digital filter 342.

The PLL 310 in the present embodiment has a function of roughly adjusting the frequency in accordance with the received input pixel clock signal IPCK and then generating a VCO clock (reproduction clock) VCK that is synchronized in phase with one serial data signal SDT0 among the plurality of serial data signals SDT0 to SDT2.

That is, the PLL 310 in the present embodiment has, in addition to a clock multiply function, a function of phase-locking the input serial data signal SDT0 on the basis of phase information from the sampler 330.

The function is determined on the basis of whether the switching circuit 317 feeds back the result in which the frequency division of the VCO clock VCK with respect to the VCO 313 is compared in frequency/phase with the input pixel clock signal IPCK by the PFD 311 or on the basis of whether the switching circuit 317 feeds back a phase difference signal between the VCO clock VCK from the sampler 330 and the input serial data signal SDT0. During normal operation, feedback from the sampler 330 is used.

That is, in a normal state, since the input pixel clock signal IPCK is not related to the operation of the PLL 310, even if the pixel clock signal PCK has any relative jitter, it is not related to the operation of the PLL 310.

In this state, no problem is posed if the VCO clock VCK continues to be locked to the serial data signal SDT0. In a rare case, this PLL 310 falls into an invalid state called a harmonic lock.

This is actually a phenomenon in which, whereas the serial data signal is composed of repetitions of "0011", the VCO clock VCK is locked to a frequency 1.5 times as high at which the serial data signal is interpreted as if it is composed of repetitions of "000111".

In order that the receiving apparatus autonomously restores itself from this state to a normal state, in the present embodiment, a frequency comparator 315 that makes active (outputs) an alarm signal ALRM in a case where the difference between the frequency division of the VCO clock VCK and the frequency of the input pixel clock signal IPCK exceeds a threshold value VTH is used.

When the alarm signal ALRM becomes active, the selection circuit 316 temporarily selects feedback from the PFD 311 until the VCO 313 is pulled into to a substantially correct frequency, and then switches to feedback from the sampler 330.

The rough adjustment of the VCO 313 is performed when the receiving apparatus starts up or after reset. The fact that such rough adjustment of the VCO is effective means for preventing harmonic lock is disclosed in Japanese Patent No. 3661890.

If the threshold value VTH of the frequency comparator 315 is appropriately set and the fluctuation in the phase difference between the pixel clock signal PCK and the VCO clock VCK is permitted, the reception of the serial data signal SDT0 can be continued without problems with respect to large high-speed relative jitter for which the phase shifter is difficult to follow in the existing technology.

Figure 4:
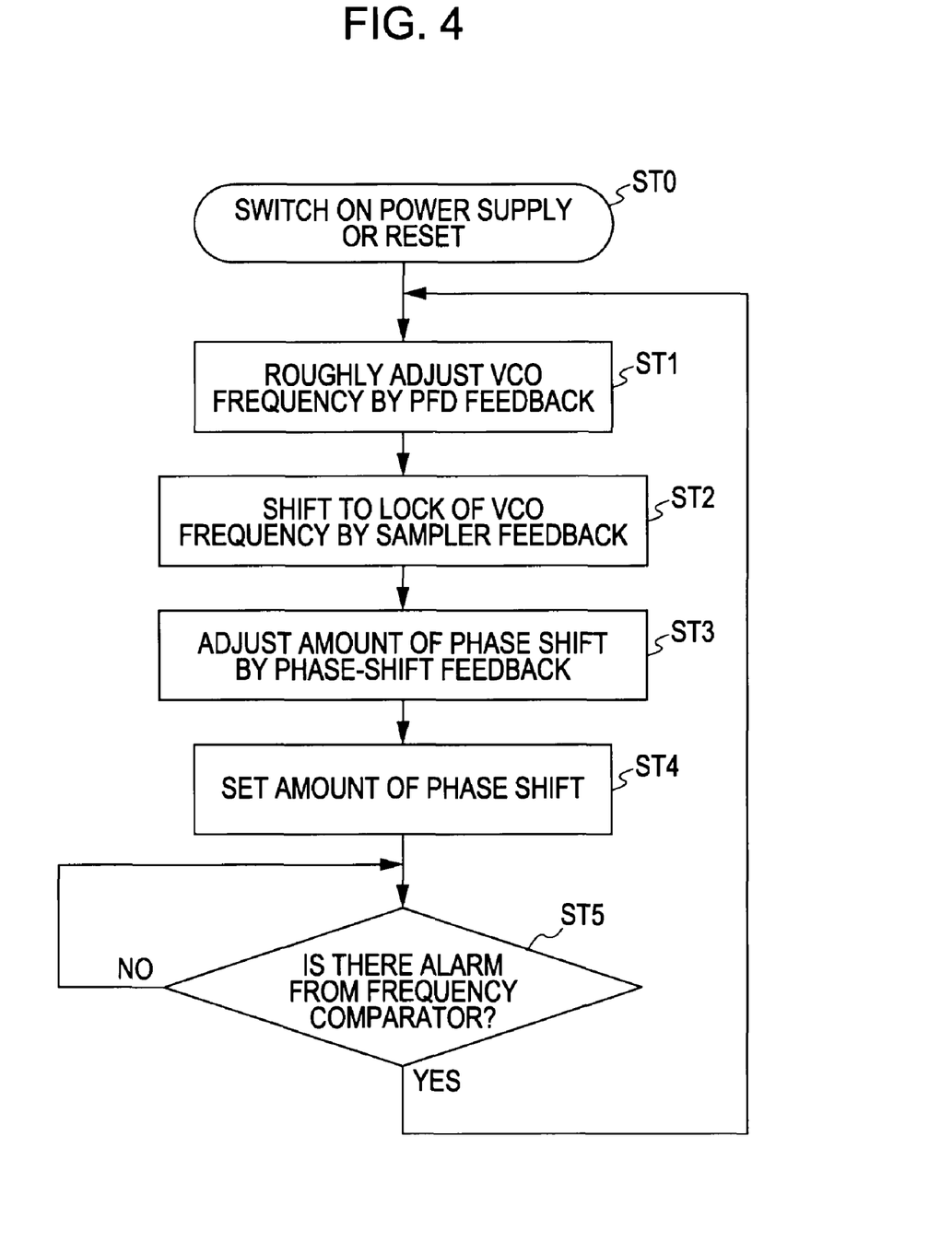
FIG. 4 is a flowchart of a series of function control in the receiving apparatus according to the first embodiment of the present invention.

FIG. 4 is a flowchart of a series of function control in the receiving apparatus according to the present embodiment.

In the present embodiment, when the power supply is switched on or when a reset is performed (ST0), rough adjustment of the oscillation frequency of the VCO 313 is performed by using the PFD feedback in which the output of the PFD 311 is included in the loop (ST1).

Next, the process shifts to a lock of the oscillation frequency of the VCO 313 by using sampler feedback in which the output of the sampler 330 is included in the loop (ST2).

Then, the adjustment of the amount of phase shift is performed by phase-shift feedback using the clock phase shifters 321 and 322, the samplers 331 and 332, and the digital filters 341 and 342 (ST3).

Then, the amount of phase shift is set (ST4).

In this state, a determination is made as to the presence or absence of the alarm signal ALRM from the frequency comparator 315 (ST5).

When it is determined in step ST5 that there is an alarm signal ALRM (is output), it is determined that the PLL 310 will fall into an invalid status called a harmonic lock, and the process proceeds to step ST1.

Next, jitter of a communication system in which a CDR method is adopted will be considered.

Figure 5:
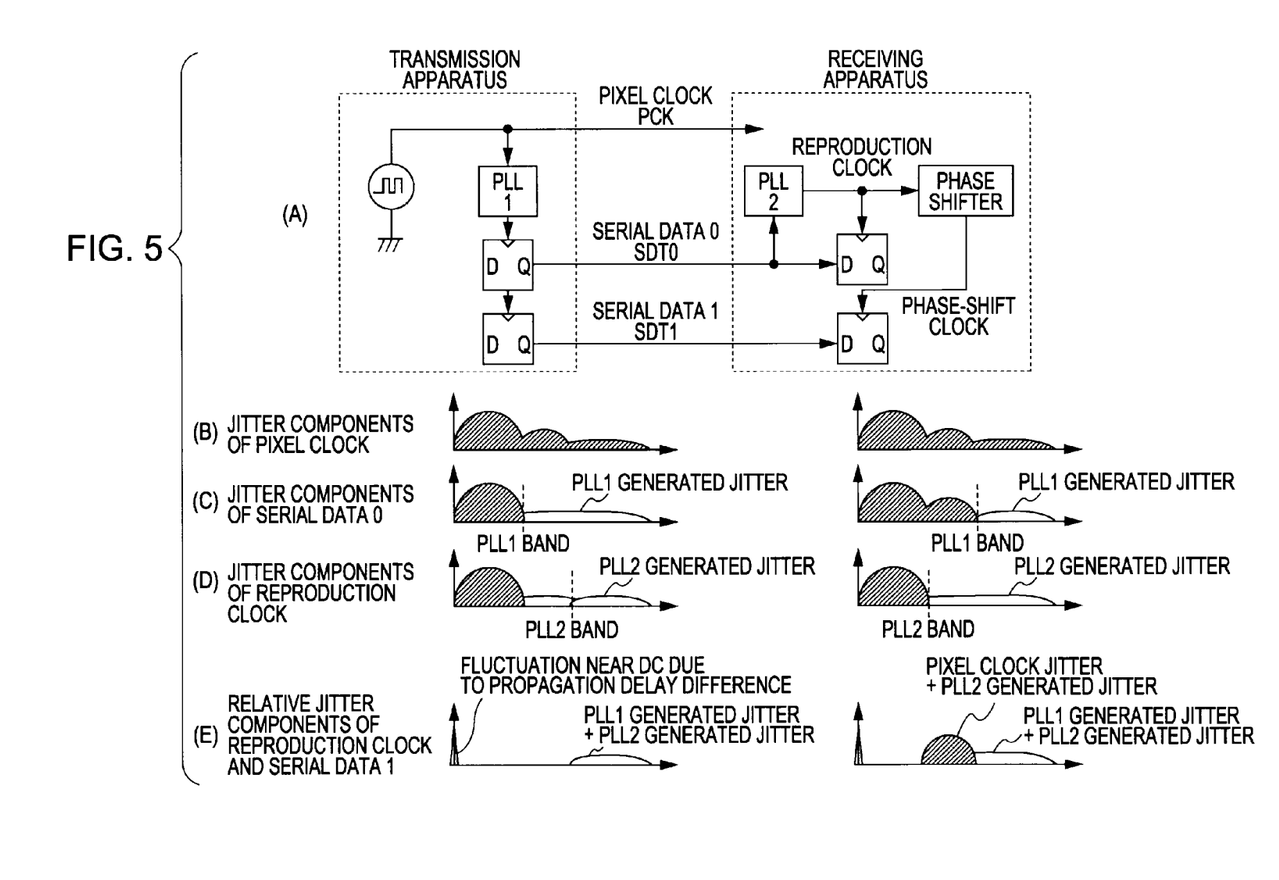
FIG. 5 illustrates jitter in a communication system including the receiving apparatus according to the first embodiment of the present invention.

FIG. 5 illustrates jitter in a communication system having the receiving apparatus according to the first embodiment of the present invention.

Figure 6:
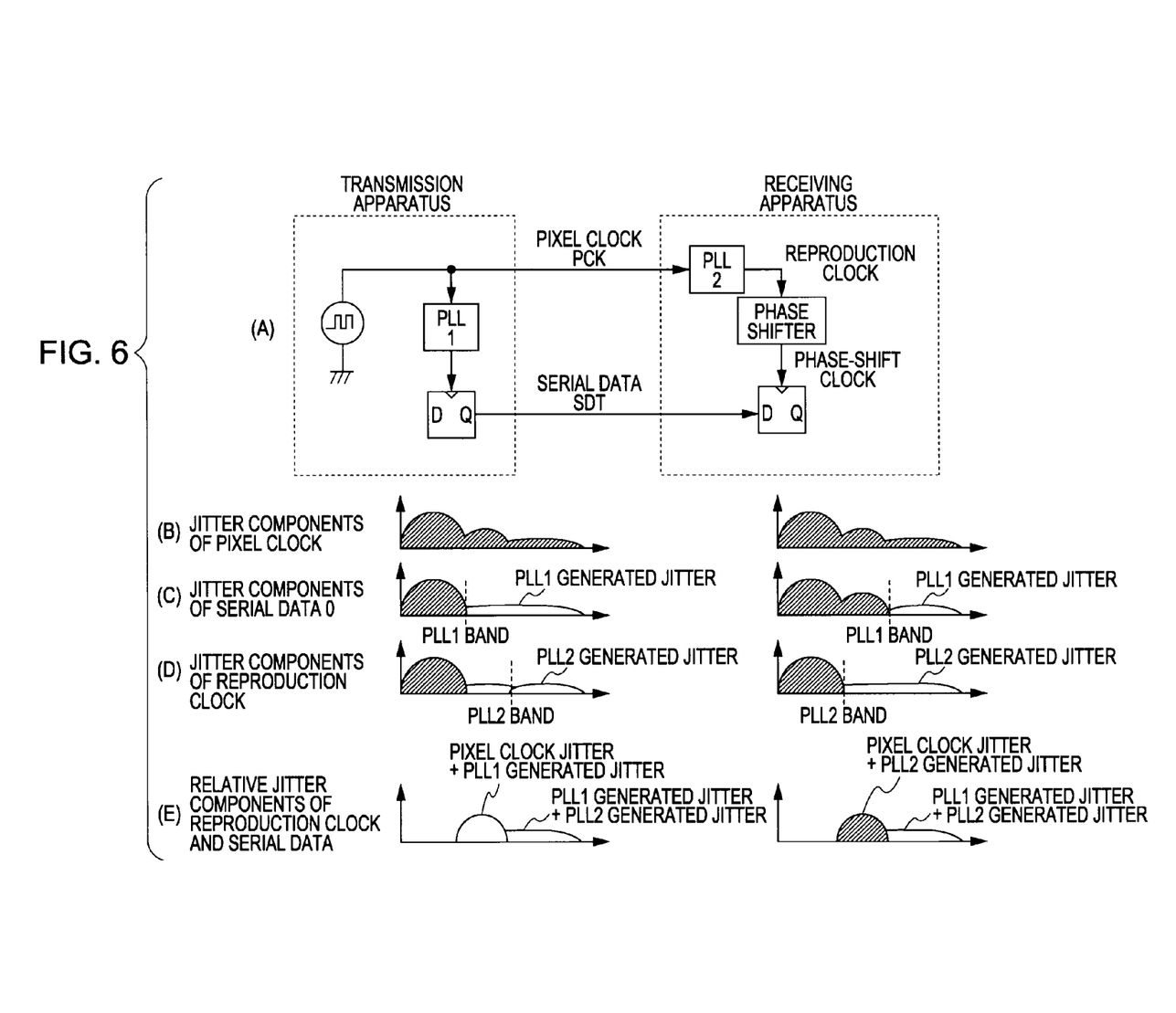
FIG. 6 illustrates, in comparison with FIG. 5, jitter in the communication system including an existing receiving apparatus.

FIG. 6 is shown as a comparison of FIG. 5, illustrating jitter in a communication system having an existing receiving apparatus.

First, the existing communication system will be considered in association with FIG. 6.

In the existing CDR, even if the bandwidth of the PLL (the PLL 2 in the figure) on the receiving apparatus side is larger or smaller than that of the PLL (the PLL 1 in the figure) on the transmission apparatus side, there is a possibility that relative jitter has large components in the frequency band of the difference, and it is necessary for the phase shifter to absorb this relative jitter.

It is difficult to make the bands of the PLLs completely match between a transmission apparatus and a receiving apparatus that are manufactured separately.

The relative jitter components of the reproduction clock (VCO clock) and the serial data, as shown in part (E) of FIG. 6, are the pixel clock jitter and the generated jitter of the PLL on the transmission apparatus side, and the generated jitter of the PLL on the transmission apparatus side and the generated jitter of the PLL on the receiving apparatus side.

Next, the communication system according to the present embodiment will be considered in association with FIG. 5.

In the CDR according to the present embodiment of the present invention, if the band of the PLL on the receiving apparatus side (the PLL 2 in the figure) is larger than the band of the PLL (the PLL 1 in the figure) on the transmission apparatus side, the relative jitter is only small jitter produced by the PLL, and the phase shifter is only necessary to absorb a propagation delay difference between items of serial data.

Making the PLL band of the receiving apparatus wider than that of the transmission apparatus is easy from the viewpoint of manufacture.

The relative jitter components of the reproduction clock (VCO clock) and the serial data, as shown in part (E) of FIG. 5, are only the generated jitter of the PLL on the transmission apparatus side and the generated jitter of the PLL on the receiving apparatus side.

That is, the serial data signal SDT1 and the serial data signal SDT2 have been synchronized at the VCO clock VCK of the PLL, which is the same as that of the serial data signal SDT0 in the transmission apparatus 200. Therefore, even if there is a fixed phase difference due to a delay difference in the transmission line, the components of jitter are substantially the same.

Therefore, as a result of phase-shifting the VCO clock VCK locked to the serial data signal SDT0, the follow-up performance of the phase shifter may be low when a phase-shift clock optimum for the reception of the serial data signal SDT1 and the serial data signal SDT2 is to be generated.

In practice, although slight variations due to temperature drift of transmission line delay exist, but the variations are often in an ignorable amount. Therefore, no problem is posed even if feedback is stopped at a stage in which the feedback of the amount of phase shift is stabilized immediately after reception is started and the amount of phase shift is set.

Stopping a digital filter necessary for phase shift feedback contributes to saved power.

Figure 7:
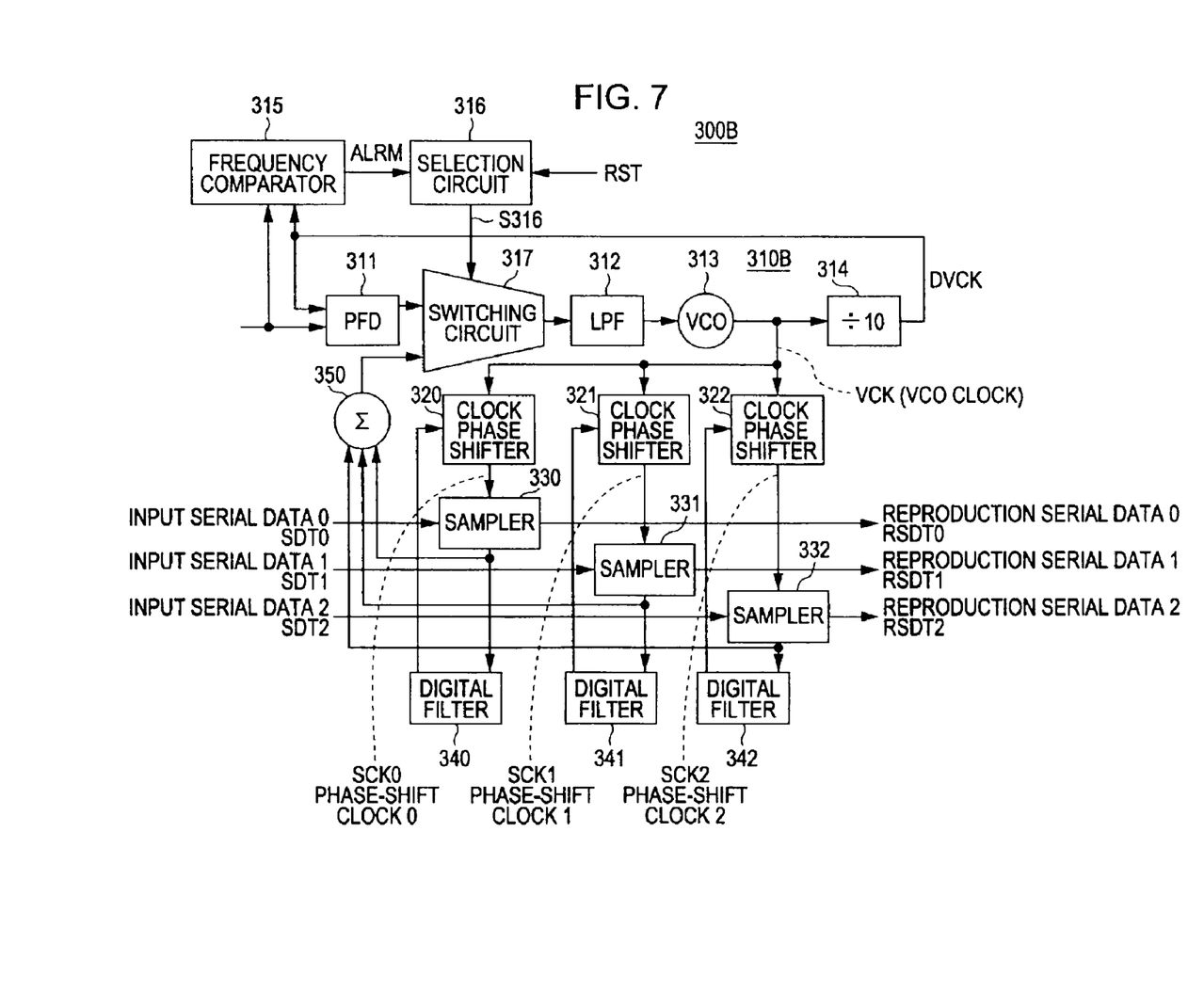
FIG. 7 shows the configuration of a receiving apparatus according to a second embodiment of the present invention.

FIG. 7 shows the configuration of a receiving apparatus 300B according to a second embodiment of the present invention.

The difference of the receiving apparatus 300B according to the second embodiment from the receiving apparatus 300A according to the first embodiment is that a PLL 310B feeds back the sum of phase information from all the samplers 330, 331, and 332 during normal operation. In FIG. 7, a summing device 350 is provided.

As a result of the above, it is possible for the PLL 310B to statistically increase the number of chances of data transition, that is, the number of chances of detecting the phase. Even when the serial data has high-speed jitter components, it is possible to widen the band of the PLL 310B so that phase locking can be correctly performed.

The phase of the VCO clock VCK obtained in this example does not also match that of the serial data signal SDT0 unlike in the first embodiment, and has a substantially fixed phase difference only.

Therefore, a clock phase shifter 320 that is similar to that for the serial data signal SDT1 and the serial data signal SDT2 of the first embodiment is only necessary to be provided for the serial data signal SDT0.

In the receiving apparatus 300B of FIG. 7, a digital filter 340 necessary for the phase-shift feedback of the clock phase shifter 320 is provided.

Figure 8:
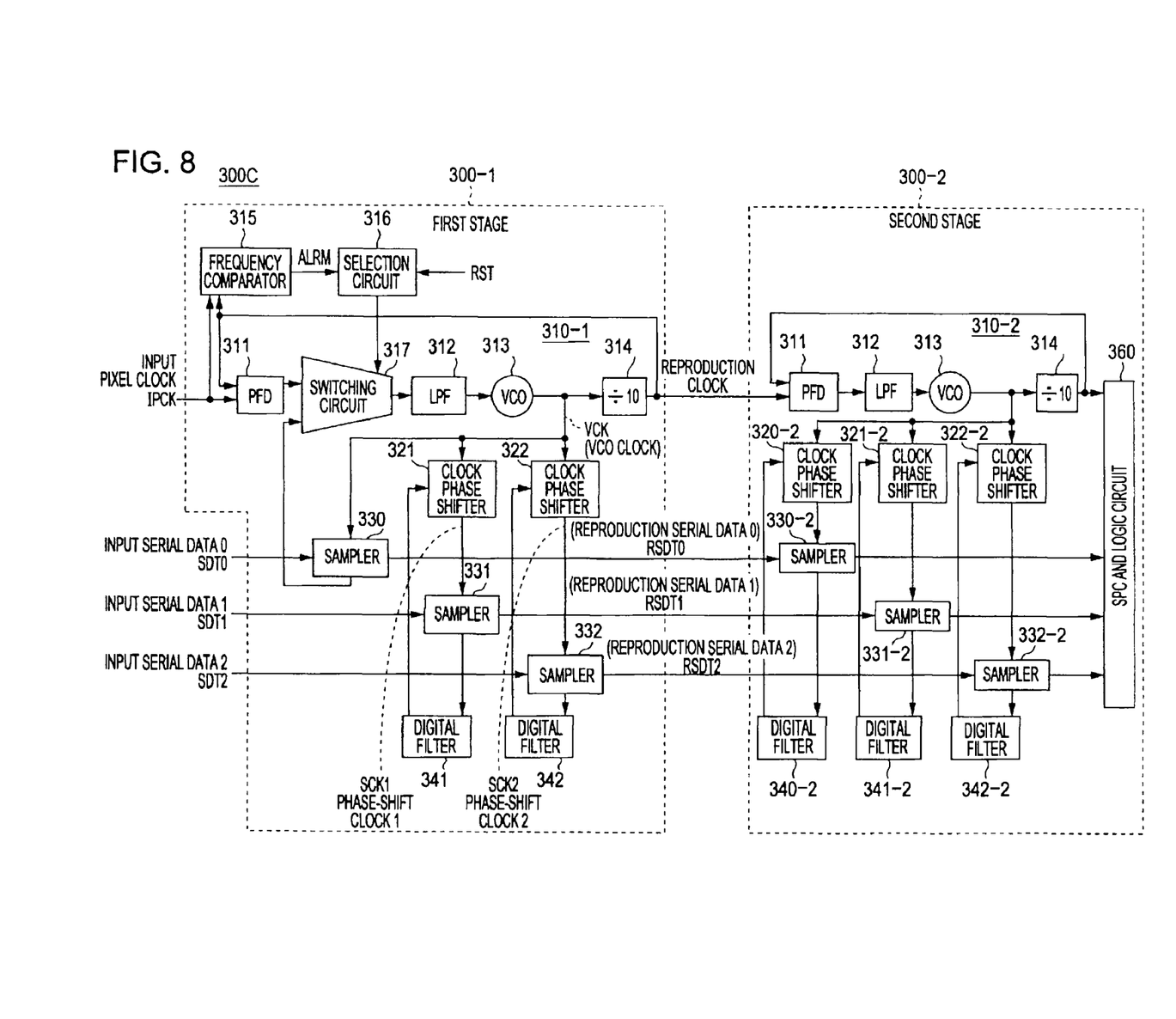
FIG. 8 shows the configuration of a receiving apparatus according to a third embodiment of the present invention.

FIG. 8 shows the configuration of a receiving apparatus 300C according to a third embodiment of the present invention.

The receiving apparatus 300C according to the third embodiment is configured in such a manner that two receiving circuits are cascaded, and a receiving circuit 300-1 at a first stage has a configuration identical to that of the receiving apparatus 300A of the first embodiment shown in FIG. 3.

A frequency-divided reproduction clock (VCO clock) RVCK generated by a receiving circuit 300-1 at a first stage, and reproduction serial data signals RSDT0, RSDT1, and RSDT2 are supplied to a receiving circuit 300-2 at a second stage.

The receiving circuit 300-2 at the second stage includes a PLL 310-2 formed of a PFD 311, a LPF 312, a VCO 313, and a frequency divider 314, which does not have the frequency comparator 315, the selection circuit 316, and the switching circuit 317; clock phase shifters 320-2, 321-2, and 322-2 to which a VCO clock (reproduction clock) VCK2 from the VCO 313 is supplied; samplers 330-2, 331-2, and 332-2 for sampling (further reproducing) reproduction serial data signals RSDT0, RSDT1, and RSDT2 by using a phase-shift clock SCK from the clock phase shifters 320-2, 321-2, and 322-2; digital filters 340-2, and 341-2, and 342-2 for performing phase-shift feedback of the clock phase shifters 320-2, 321-2, and 322-2; and an SPC and logic circuit 360.

The VCO 313-1 of the PLL 310-1 of the receiving circuit 300-1 at the first stage has been locked to the serial data signal SDT0, and outputs a pixel clock signal PCK that is generated by frequency-dividing the serial data signal SDT0.

Since the reproduction serial data signals RSDT0, RSDT1, and RSDT2 that are input to the receiving circuit 300-2 at the second stage and the pixel clock signal PCK has been synchronized in phase, the clock phase shifters 320-2, 321-2, and 322-2 at the second stage used for clock data reproduction are not necessary to have followability with respect to high-speed phase variations.

As a result, the CDR-compliant receiving circuit 300-2 at the second stage can be simplified.

Figure 9:
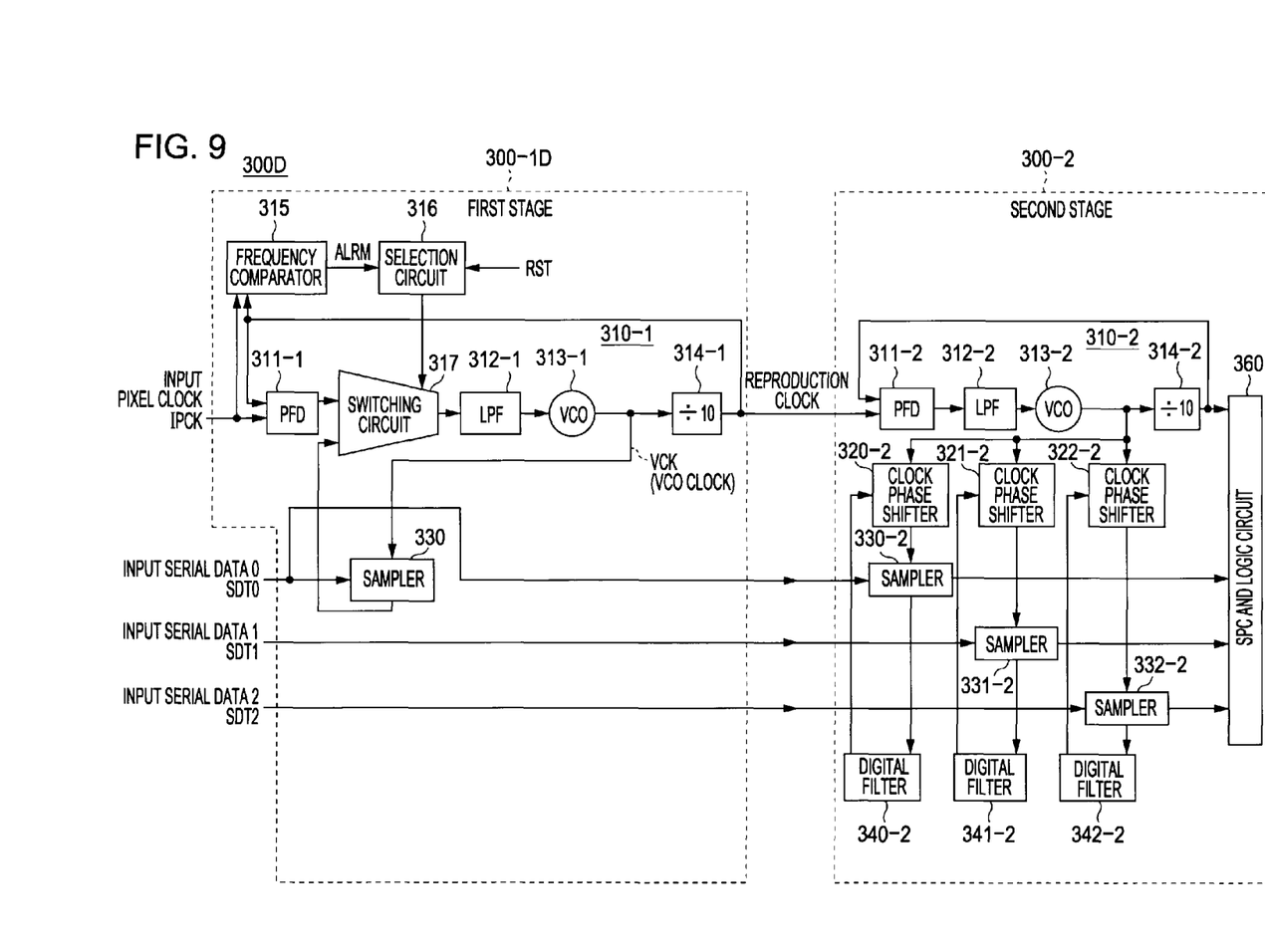
FIG. 9 shows the configuration of a receiving apparatus according to a fourth embodiment of the present invention.

FIG. 9 shows the configuration of a receiving apparatus 300D according to a fourth embodiment of the present invention.

The difference of the receiving apparatus 300D according to the fourth embodiment from the receiving apparatus 300C of the third embodiment is that a receiving circuit 300-1D at a first stage directly supplies the serial data signals SDT1 and SDT2 to a next stage.

Therefore, the receiving circuit 300-1D at the first stage is not provided with the clock phase shifters 321-1 and 322-1, the samplers 331-1 and 332-1, and the digital filters 341-1 and 342-1.

In the pixel clock signal PCK and the serial data signal, which are transmitted to the receiving circuit 300-2 at the second stage, differences occur in the jitter components in a region outside the PLL band at the first stage. However, a region outside the PLL band of the transmitter at the first stage that produced the input serial data has only small jitter components that occurred in the PLL.

Therefore, if the band of the PLL 310-1 at a stage before reception is larger than that of the PLL of the transmission apparatus, the jitter of the input pixel clock signal PCK at the second stage, which is an output thereof, is almost equal to the jitter components of the serial data signals SDT0, SDT1, and SDT2, which are supplied directly to the receiving circuit 300-2 at the second stage by the receiving circuit 300-1D at the first stage. As a consequence, the simplification of the CDR at the second stage, which is similar to the third embodiment, can be expected.

Figure 10:
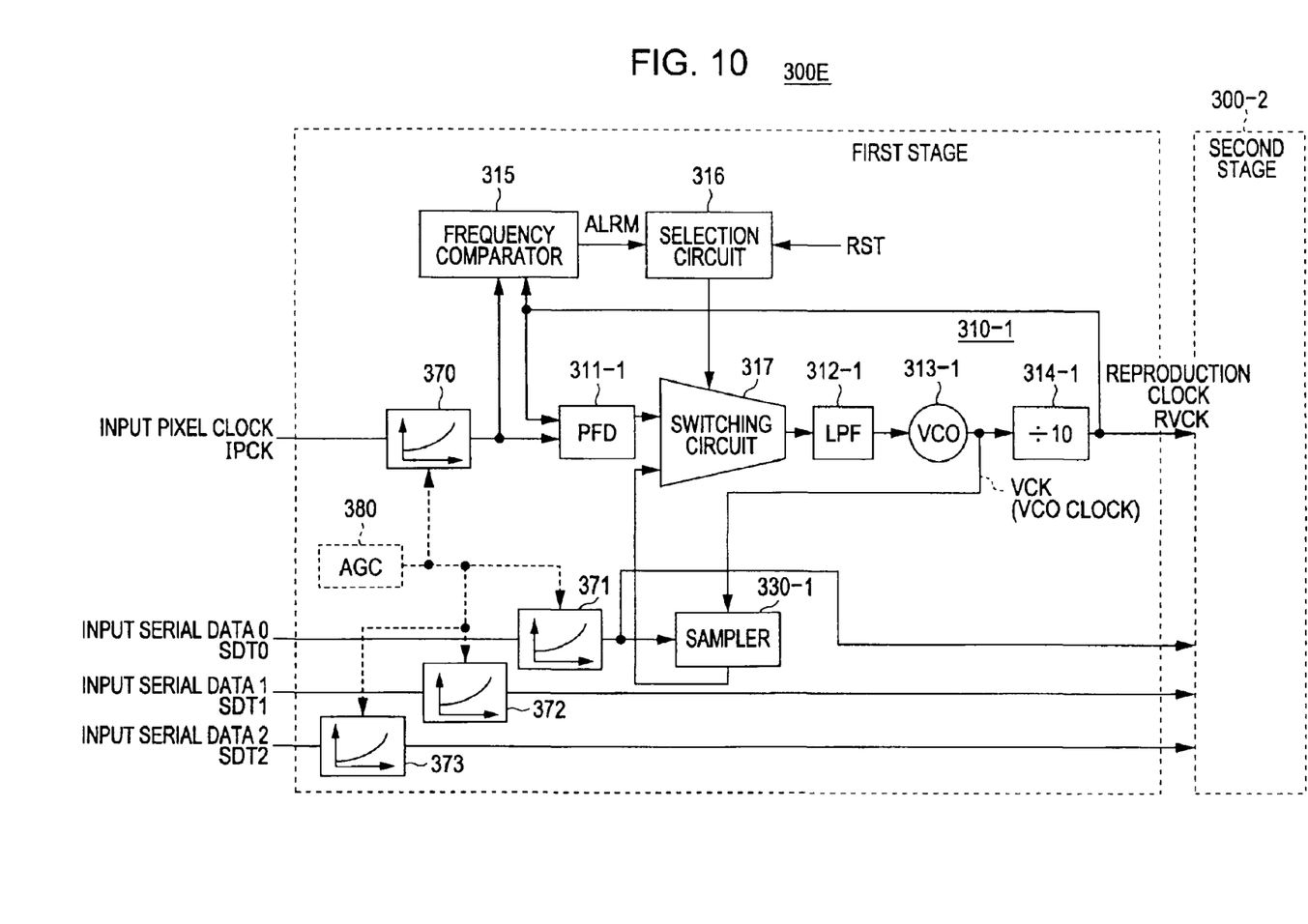
FIG. 10 shows the configuration of a receiving apparatus according to a fifth embodiment of the present invention.

FIG. 10 shows the configuration of a receiving apparatus 300E according to a fifth embodiment of the present invention.

The difference of the receiving apparatus 300E of the fifth embodiment from the fourth embodiment is that cable equalizers 370, 371, 372, and 373 are provided in the input stage of the pixel clock signal PCK and in the input stage of the serial data signals SDT0, SDT1, and SDT2.

It is possible for the cable equalizers to remove inter-symbol interference (ISI) jitter, which is high-speed jitter that is difficult to be removed by the PLL. Therefore, relative jitter of the serial data and the pixel clock, which are supplied from the first stage to the second stage, is further decreased, and the margin of the PLL at the second stage increases.

It is also possible to provide an automatic gain control (AGC) circuit 380 for the cable equalizers 370 to 373.

Figure 11:
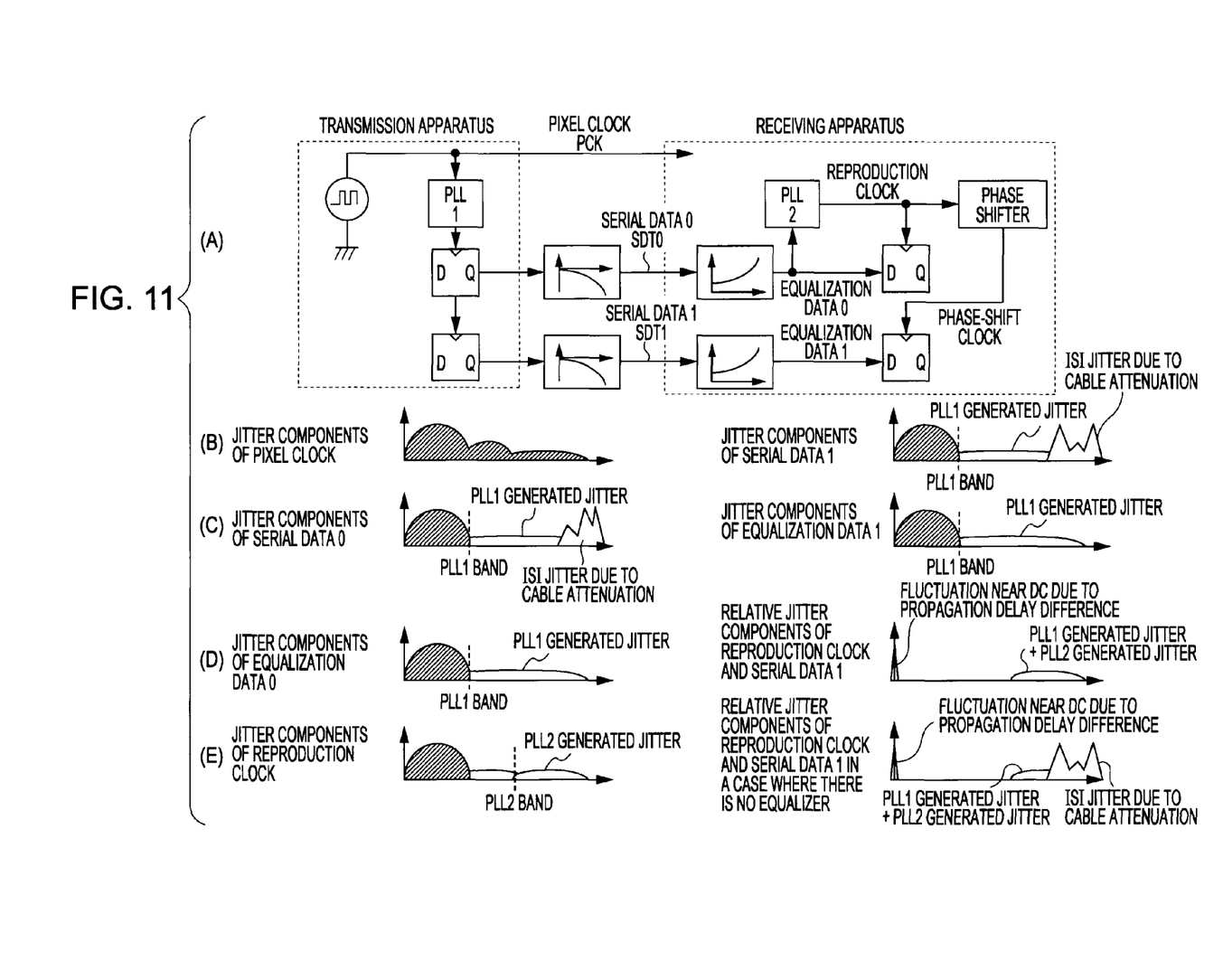
FIG. 11 illustrates jitter in a communication system including the receiving apparatus of the fifth embodiment of the present invention.

FIG. 11 illustrates jitter in a communication system including the receiving apparatus of the fifth embodiment of the present invention.

In a case where there is an attenuation of low-pass characteristics of, for example, a long cable in the transmission line, ISI jitter is carried in a serial data signal at the input end of the receiving apparatus. This is jitter that changes according to the content of the serial data signal even if the cable characteristics are the same.

The ISI jitter of the serial data signal SDT0 is not reflected in the reproduction clock (VCO clock) because it is outside the band of the PLL on the receiving apparatus side (the PLL 2 in the figure), but the ISI of the serial data signal SDT1 allows relative jitter to be directly suppressed.

The equalizer 371 of the serial data signal SDT0 has an effect of preventing the PLL on the receiving apparatus side from malfunctioning because ISI jitter is too large.

According to the above-described embodiments, the communication system 100 is constituted by the transmission apparatus 200 for transmitting a plurality of serial data signals SDT0 to STD2 that are synchronized in phase with one another and a pixel clock signal PCK that is a clock signal that is synchronized in frequency with the frequency synchronization serial data signals SDT0 to SDT2; and the receiving apparatus 300 including a phase synchronization circuit (PLL) for generating a reproduction clock that is synchronized in phase with one serial data signal among the plurality of serial data signals SDT0 to SDT2, for example, the serial data signal SDT0, after the frequency is roughly adjusted in accordance with the received input pixel clock signal PCK, and phase shifters for shifting the phase from the reproduction clock and locking the phase to another serial data signal. Therefore, the following advantages can be obtained.

That is, according to the CDR configuration of the present embodiment, in a case where a rough frequency is given a clock serving as a measure of the bit rate of serial data, even if there is large high-speed relative jitter in clock and data, it is possible to reproduce a clock optimum for data reproduction that correctly follows the phase of the serial data signal.

Furthermore, if the CDR is configured as two stages and the present invention is applied to a first stage, a PLL at a second stage can be simplified, and an operation can be made to have a margin.

Furthermore, by applying a cable equalizer to the present invention, it is possible to configure a stable receiver in which all jitter that occurs in TMDS of HDMI can be effectively suppressed.

It should be understood by those skilled in the art that various modifications, combinations, sub-combinations and alterations may occur depending on design requirements and other factors insofar as they are within the scope of the appended claims or the equivalents thereof.

What is claimed is:

1. A communication system comprising:
   a transmission apparatus configured to transmit a plurality of serial data signals that are synchronized in phase with one another, and a clock signal that is synchronized in frequency with the serial data signals; and
   a receiving apparatus configured to receive the plurality of serial data signals and the clock signal transmitted from the transmission apparatus,
   wherein the receiving apparatus includes:
     a phase synchronization circuit configured to adjust the frequency in accordance with the received clock signal and generate a reproduction clock that is synchronized in phase with one serial data signal among the plurality of serial data signals, and
     a phase shifter configured to shift the phase from the reproduction clock and lock the phase to another serial signal,
     wherein the phase synchronization circuit includes a selection circuit configured to feed back, based on whether an alarm signal is received, the received clock signal to a phase synchronization loop or a serial data signal from a reproduction circuit.

2. A receiving apparatus comprising:
   a receiver configured to receive a plurality of serial data signals that are synchronized in phase with one another, and a clock signal that is synchronized in frequency with the serial data signals;
   a phase synchronization circuit configured to adjust the frequency in accordance with the received clock signal and generate a reproduction clock that is synchronized in phase with one serial data signal among the plurality of serial data signals; and
   a phase shifter configured to shift the phase from the reproduction clock and lock the phase to another serial data signal, wherein the phase synchronization circuit includes a selection circuit configured to feed back, based on whether an alarm signal is received, the received clock signal to a phase synchronization loop or a serial data signal from a reproduction circuit.

3. The receiving apparatus according to claim 2, wherein the reproduction circuit is configured to reproduce the one serial data signal in synchronization with the reproduction clock, wherein the phase synchronization circuit includes:
a voltage-controlled oscillator configured to generate the reproduction clock,
a frequency divider configured to divide the frequency of the reproduction clock,
a phase comparator configured to compare the phase of the reproduction clock from the frequency divider with the phase of the received clock signal, and
a frequency comparator configured to compare the frequency of the reproduction clock from the frequency divider with the frequency of the clock signal and output an alarm signal when the difference between the frequencies is greater than a preset threshold value, and
the selection circuit, when at least the alarm signal is received, feeds back an output signal of the phase comparator to the phase synchronization loop formed by the phase comparator, the voltage-controlled oscillator, and the frequency divider, and, when no alarm signal is received, feeds back the serial data signal from the reproduction circuit.

4. The receiving apparatus according to claim 3, wherein, when a power supply is switched on or at reset time, the selection circuit feeds back the output signal of the phase comparator to the phase synchronization loop regardless of the presence or absence of the alarm signal.

5. The receiving apparatus according to claim 3, further comprising a second reproduction circuit configured to reproduce a serial data signal from another received serial data signal in synchronization with a phase-shift clock from the phase shifter.

6. The receiving apparatus according to claim 5, further comprising a digital filter configured to perform phase-shift feedback of an output signal of the second reproduction circuit to a corresponding phase shifter.

7. The receiving apparatus according to claim 5, further comprising a phase shifter configured to, upon receiving the reproduction clock, supply a phase clock to the reproduction circuit configured to reproduce the one serial data signal,
wherein, when no alarm signal is received, the selection circuit feeds back the sum of phase information on the serial data signals from the plurality of reproduction circuits to the phase synchronization loop.

8. The receiving apparatus according to claim 7, further comprising a digital filter configured to perform phase-shift feedback of the output signals of the plurality of reproduction circuits to a corresponding phase shifter.

9. The receiving apparatus according to claim 5, further comprising a receiving circuit at a second stage configured to receive the reproduction clock from the frequency divider and the reproduction serial data signal of each of the reproduction circuits,
wherein the receiving circuit at the second stage includes:
a phase synchronization circuit configured to generate a reproduction clock that is synchronized in phase with the received clock signal;
a plurality of phase shifters configured to shift the phase from the reproduction clock and lock the phase to the received serial data signals; and
a reproduction circuit configured to further perform a reproduction process on serial data signals that are input in synchronization with phase clocks from the plurality of phase shifters.

10. The receiving apparatus according to claim 6, further comprising a receiving circuit at a second stage configured to input a reproduction clock from the frequency divider and a reproduction serial data signal of each of the production circuits,
wherein the receiving circuit at the second stage includes:
a phase synchronization circuit configured to generate a reproduction clock that is synchronized in phase with the received clock signal;
a plurality of phase shifters configured to shift the phase from the reproduction clock and lock the phase to the received serial data signals;
a reproduction circuit configured to further perform a reproduction process on serial data signals that are input in synchronization with phase clocks from the plurality of phase shifters; and
a plurality of digital filters configured to performed phase-shift feedback of the output signals of the plurality of reproduction circuits to corresponding phase shifters.

11. The receiving apparatus according to claim 3, further comprising a receiving circuit at a second stage configured to directly receive a reproduction clock from the frequency divider and a plurality of received reproduction serial data signals,
wherein the receiving circuit at the second stage includes:
a phase synchronization circuit configured to generate a reproduction clock that is synchronized in phase with the received clock signal,
a plurality of phase shifters configured to shift the phase from the reproduction clock and lock the phase to the received serial data signals, and
a reproduction circuit configured to further perform a reproduction process on serial data signals that are input in synchronization with phase clocks from the plurality of phase shifters.

12. The receiving apparatus according to claim 3, further comprising a receiving circuit at a second stage configured to directly receive a reproduction clock from the frequency divider and a plurality of received reproduction serial data signals,
wherein the receiving circuit at the second stage includes:
a phase synchronization circuit configured to generate a reproduction clock that is synchronized in phase with the received clock signal,
a plurality of phase shifters configured to shift the phase from the reproduction clock and lock the phase to the received serial data signals,
a reproduction circuit configured to further perform a reproduction process on serial data signals that are input in synchronization with the phase clocks from the plurality of phase shifters, and
a plurality of digital filters configured to perform phase-shift feedback of the output signals of the plurality of reproduction circuits to a corresponding phase shifter.

13. The receiving apparatus according to claim 11, wherein a cable equalizer is arranged in at least one of the input stage of the received clock signal and the input stage of the plurality of serial data signals.

14. The receiving apparatus according to claim 12, wherein a cable equalizer is arranged in at least one of the input stage of the received clock signal and the input stage of the plurality of serial data signals.

15. A receiving method implemented by a receiving apparatus, comprising:
- receiving a plurality of serial data signals that are synchronized in phase with one another and a clock signal that is synchronized in frequency with the serial data signals;
- adjusting the frequency in accordance with the received clock signal and generating a reproduction clock that is synchronized in phase with one serial data signal among the plurality of serial data signals; and
- shifting the phase from the reproduction clock and locking the phase to another serial data signal,
- wherein the adjusting includes feeding back, based on whether an alarm signal is received, the received clock signal to a phase synchronization loop or a serial data signal from a reproduction circuit.

* * * * *